US012568667B2

(12) United States Patent
Chen et al.

(10) Patent No.:  US 12,568,667 B2
(45) Date of Patent:      Mar. 3, 2026

(54) IN-SITU STRAINING EPITAXIAL PROCESS

(71) Applicant: Taiwan Semiconductor Manufacturing Company, Ltd., Hsin-Chu (TW)

(72) Inventors: Hsiu-Ting Chen, Tainan City (TW); Yi-Ming Huang, Tainan City (TW); Shih-Chieh Chang, Taipei City (TW); Hsing-Chi Chen, Hsin-Chu City (TW); Pei-Ren Jeng, Chu-Bei City (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 822 days.

(21) Appl. No.: 17/717,238

(22) Filed: Apr. 11, 2022

(65) Prior Publication Data

US 2022/0238656 A1      Jul. 28, 2022

Related U.S. Application Data

(60) Continuation of application No. 16/866,279, filed on May 4, 2020, now Pat. No. 11,302,782, which is a division of application No. 14/174,588, filed on Feb. 6, 2014, now Pat. No. 10,644,116.

(51) Int. Cl.
| | |
|---|---|
| *H10D 30/69* | (2025.01) |
| *H10D 62/00* | (2025.01) |
| *H10D 62/13* | (2025.01) |
| *H10D 62/53* | (2025.01) |
| *H10D 62/834* | (2025.01) |

(52) U.S. Cl.
CPC ......... *H10D 62/834* (2025.01); *H10D 30/797* (2025.01); *H10D 62/021* (2025.01); *H10D 62/151* (2025.01); *H10D 62/53* (2025.01)

(58) Field of Classification Search
CPC ............................ H10D 30/797; H10D 62/53
See application file for complete search history.

(56) References Cited

U.S. PATENT DOCUMENTS

| | | | | |
|---|---|---|---|---|
| 8,404,546 | B2 * | 3/2013 | Woon ................ | H01L 21/26586 |
| | | | | 438/528 |
| 11,302,782 | B2 * | 4/2022 | Chen .................... | H10D 62/021 |
| 2003/0213964 | A1 | 11/2003 | Flynn et al. | |
| 2006/0003533 | A1 * | 1/2006 | Kammler ............. | H10D 64/259 |
| | | | | 438/300 |
| 2006/0292719 | A1 | 12/2006 | Lochtefeld et al. | |
| 2007/0087581 | A1 | 4/2007 | Singh et al. | |
| 2007/0290192 | A1 * | 12/2007 | Rotondaro ............. | H10D 84/83 |
| | | | | 257/19 |
| 2011/0049568 | A1 * | 3/2011 | Lochtefeld ........ | H01L 21/28264 |
| | | | | 257/190 |

(Continued)

*Primary Examiner* — Ali Naraghi

(74) *Attorney, Agent, or Firm* — HAYNES AND BOONE, LLP

(57) ABSTRACT

A semiconductor device includes an epitaxial straining region formed within a semiconductor substrate, the straining region being positioned adjacent to a gate stack, the gate stack being positioned above a channel. The straining region comprises a defect comprising two crossing dislocations such that a cross-point of the dislocations is closer to a bottom of the straining region than to a top of the straining region. The straining region comprises an element with a smaller lattice constant than a material forming the substrate.

20 Claims, 4 Drawing Sheets

(56) References Cited

U.S. PATENT DOCUMENTS

| | | | | |
|---|---|---|---|---|
| 2012/0104474 A1* | 5/2012 | Yin | .................... | H10D 84/017 |
| | | | | 257/E21.409 |
| 2013/0146895 A1* | 6/2013 | Tsai | .................. | H10D 30/0227 |
| | | | | 257/77 |
| 2015/0097197 A1 | 4/2015 | Ganz et al. | | |
| 2015/0295085 A1 | 10/2015 | Yu et al. | | |
| 2016/0204256 A1* | 7/2016 | Jackson | .............. | H10D 30/751 |
| | | | | 438/285 |

\* cited by examiner

100

300

302
306
308
310
304

400

402
410
408
406
404

500

Forming a recess in a semiconductor substrate, the recess being adjacent to a gate stack — 502

Performing an epitaxial growth process within the recess to form a straining region — 504

Forming a defect within the straining region in-situ with the epitaxial growth process. — 506

IN-SITU STRAINING EPITAXIAL PROCESS

PRIORITY INFORMATION

This application is a continuation of U.S. patent application Ser. No. 16/866,279 filed May 4, 2020 and entitled "In-situ Straining Epitaxial Process," which is a divisional of U.S. patent application Ser. No. 14/174,588 filed Feb. 6, 2014 and entitled "In-situ Straining Epitaxial Process," the disclosures of which are hereby incorporated by reference in the entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as semiconductor devices, such as metal-oxide-semiconductor field-effect transistors (MOSFETs), are scaled down through various technology nodes, strained source/drain features (e.g., stressor regions) have been implemented to enhance carrier mobility and improve device performance. For example, in an N-type metal oxide semiconductor (NMOS) device, the channel between the source and drain region can have increased carrier mobility through tensile strain.

Although existing approaches to forming stressor regions for IC devices have been generally adequate for their intended purposes, they have not been entirely satisfactory in all respects. Accordingly, it is desirable to have processes that create tensile stressed channels in an efficient manner.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
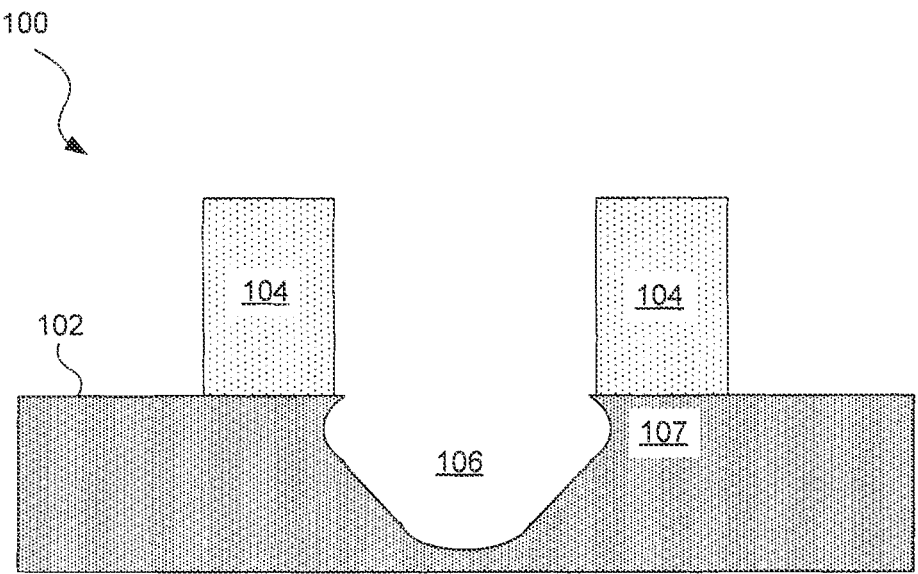
FIGS. 1A-1B are diagrams showing an illustrative fabrication process for forming an in-situ straining defect during an epitaxial process, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
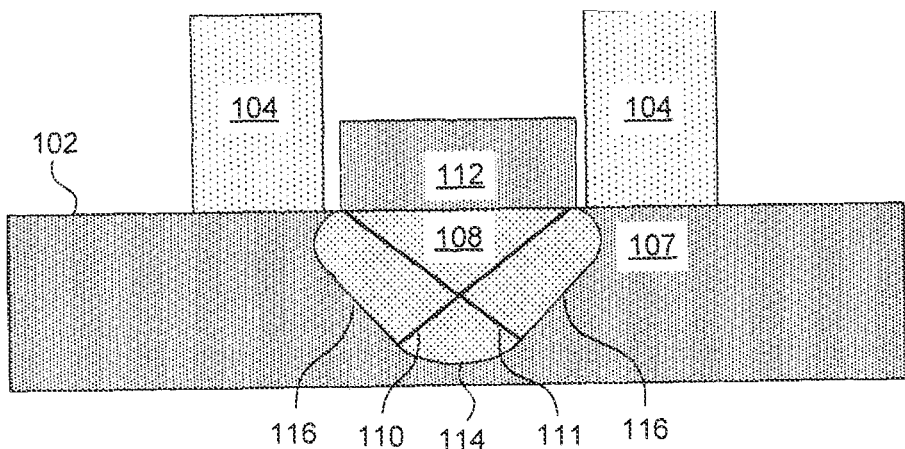

FIGS. 1A-1B are diagrams showing an illustrative fabrication process for forming an in-situ straining defect during an epitaxial process. The process begins with a substrate 102. In one embodiment, the substrate includes silicon, although other materials, including combination of materials and/or layers may be used.

Structures 104 are provided over the substrate 102. The structures may be made of a conductive material such as a metal or polysilicon material, or a stack of materials. In the present embodiment, the structures 104 are gates structures, include a gate dielectric, and are part of transistor devices. A transistor can be used as a switching device. Based on the voltage being applied to the gate 104, electric current will be either allowed to flow between the source and drain region on both sides of the gate 104, or it will be inhibited from flowing between the source and drain regions on either side of the gate.

FIG. 1A illustrates the formation of a recess 106. Continuing with the transistor embodiment discussed above, the recess 106 is formed where a source/drain region is to be formed. According to the present example, the recess 106 is formed within the substrate 102, adjacent and between the two gate structures 104.

The areas beneath the gates 104 where electric current flows between the source and drain regions are referred to as the channels 107. Transistor devices may be p-type devices or n-type devices. In general, it is desirable to make the channels 107 more amenable to the type of carrier for a particular type of transistor device. For example, for n-type devices, the majority carrier is electrons and the minority carrier is electron holes. Thus, it is desirable to increase the carrier mobility for electrons in a channel 107 of an n-type device.

One way to increase the carrier mobility for electrons is to provide a tensile strain on the channels 107. A tensile strain is a stretching force. To do this, the source or drain region adjacent to the gate may be formed as a straining region.

FIG. 1B is a diagram showing an illustrative formation of the straining region 108 within the recess 106. According to the present example, the straining region 108 is formed using an epitaxial process. The straining region 108 also includes a defect that is formed in-situ with the epitaxial process. As will be described in further detail below, the straining region 108 causes a tensile strain on the channel region 107 underneath the gate 104.

According to the present example, the straining region 108 is formed using an epitaxial growth process. Such a process involves growing a crystal structure on top of a pre-existing crystal structure. Specifically, epitaxy refers to the deposition of a crystalline overlayer on a crystalline substrate. Additionally, the crystal structure being formed registers with the crystal structure of the substrate on which the epitaxial process is performed. Specifically, the deposited film may lock into one or more crystallographic orientations with respect to the substrate crystal.

The straining region 108 may be formed of a material such as silicon carbide (SiC). When silicon is mixed with carbon, it produces a material with a smaller lattice constant. A lattice constant is the distance between corresponding points of adjacent cells within the crystal structure. Because carbon is a smaller element than silicon, the lattice constant of a crystal structure of silicon carbide is smaller than the lattice constant of pure silicon.

The straining region 108 may also be doped with an n-type dopant such as phosphorous. The n-type dopant creates an n-type semiconductor which is used for an NMOS device. NMOS devices are typically used to complement P-type metal oxide semiconductor (PMOS) devices.

The epitaxial growth process can be designed so that when the straining region 108 is being formed, a defect is formed as well. The defect within the straining region 108 helps cause tensile stress on the channel region 107. A defect within a crystal structure is an interruption in the pattern of the crystal. For example, a dislocation defect occurs when the pattern of the crystal gets shifted at a specific point.

In the present example, the defect includes a first dislocation 110 and a second dislocation. The first dislocation 110 and the second dislocation cross at a specific point, which will be referred to as the cross-point. The dislocations 110, 111 are formed in-situ. Thus, the dislocation does not exist within the substrate 102. Rather, the dislocations 110, 111 start at the epitaxially grown straining region 108.

In one example, the defects are caused during formation of the straining region 108 by tuning the epitaxial growth process. For example, the epitaxial growth process may be applied differently at different angles. For example, the epitaxial growth process may have a faster rate of application on the sides 116 of the recess than at the bottom 114 of the recess. This will cause the dislocations 110, 111 to form at the desired positions. Other differences between the epitaxial growth applied to the sides 116 and the epitaxial growth applied to the bottom 114 can cause the dislocation as well.

Additionally, various parameters of the epitaxial growth process can be used to tune the precise position of the dislocation and the nature of the dislocation. For example, variations in temperature, pressure, doping concentration, and precursor type may have an effect on the angle of the dislocation as well as the position of the cross-point. Variations in the dislocation can be used to apply a desired amount of tensile stress to the channel region 107.

According to the present example, a silicon layer 112 is formed on top of the straining region 108. The silicon layer 112 is also doped with the same type of dopant as the underlying straining region 108, thus making it conductive. The silicon layer 112 is also formed using an epitaxial growth process. Thus, the silicon layer 112 is grown on the crystal of the straining region 108.

The silicon layer 112 may be used to provide better contact to a later-applied conductive material. For example, typically, the gate device, and source/drain regions are connected to interconnect layers above through conductive vias. These vias are made of an electrically conductive material such as metal. A better connection to the source/drain region, which in this case is the straining region 108, can be provided through use of the silicon layer 112.

Figure 2:
FIG. 2 is a diagram showing a cross-sectional view of a region formed by an epitaxial process, in accordance with some embodiments.
Figure 2:
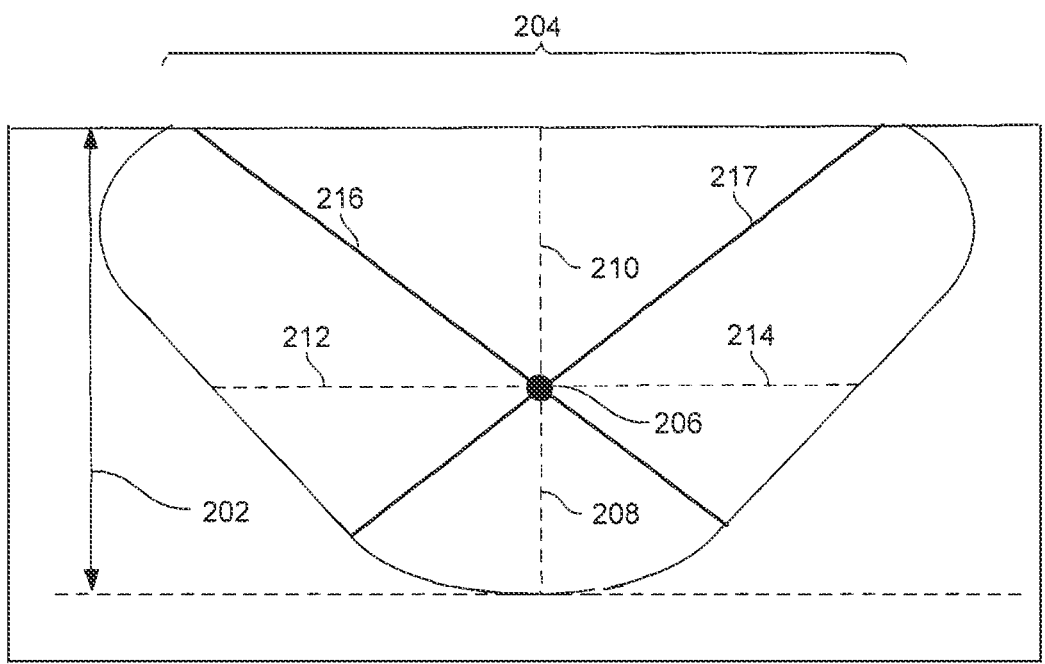

FIG. 2 is a diagram showing a cross-sectional view of a straining region 200 formed by an epitaxial process, such as the straining region 108 of FIG. 1B. According to the present example, the recess is formed at a specified depth 202 and a specified width 204. Thus straining region 200 formed within that recess thus shares that depth 202 and width 204.

The straining region 200 includes a defect of two dislocations 216, 217. The dislocations cross at a specific point, which will be referred to as the cross-point 206. The distance between the cross-point 206 and the bottom of the straining region is indicated by dotted line 208. The distance between the cross-point 206 and the top of the straining region 200 is indicated by dotted line 210. The distance between the cross-point 206 and the sides of the straining region 200 are indicated by dotted lines 212 and 214.

The location of the cross-point 206 may be adjusted in a variety of ways. For example, the length of dotted lines 212 and 214 may be adjusted by adjusting the width 204 of the recess, or the depth of the cross-point 206. The depth of the cross-point 206 may be adjusted by adjusting the angle of the dislocations 216, 217.

In general, the dislocations 216, 217 may be at an angle such that the distance between the cross-point 206 and either side is equal. In other words, the x-shape made by the dislocations is symmetrical. But, in some cases, the angles of the dislocation may not be exactly similar, which will cause lengths 212 and 214 to be of slightly different sizes.

In some examples, it may be desirable to have the cross-point 206 at a relatively low depth. Thus, instead of the cross-point 206 being closer to a top of the straining region 200, the cross-point 206 may be closer to the bottom of the straining region 200. Accordingly, the length of dotted line 208 is less than the length of dotted line 210. The depth of the cross-point 206 may be adjusted to better provide the desired tensile strain on the channel region (e.g. 107, FIG. 1).

The location of the cross-point 206 may be tuned by adjusting various parameters of the epitaxial growth process. For example, various parameters such as temperature, pressure, doping concentration, materials used, and precursor type may affect the angle at which the dislocations are formed in-situ. Thus, the location of the cross-point 206 can be adjusted as desired based on changing such parameters.

The location of the cross-point 206 can be adjusted by changing the doping concentration of the straining region 200. The straining region 200 is part of the source/drain region and should thus be doped accordingly. Various dopants can be added to the epitaxial growth process. Specifically, n-type dopants may be used, such as phosphorous. Other n-type dopants are contemplated.

The location of the cross-point 206 can also be adjusted by changing the ratio of silicon to an element with a smaller crystal lattice. For example, as mentioned above, the straining region may be made of a material such as silicon carbide. Because carbon is a smaller element, the crystal structure of silicon carbide has a smaller lattice constant. This helps cause the desired tensile stress on the channel region. The ratio of silicon to carbon in such a compound can affect the nature of the dislocations and thus the location of the cross-point 206.

The location of the cross-point 206 may also be affected by the type of precursor. The precursor is typically a gas that provides the silicon atoms to be deposited onto the substrate during the epitaxial growth process. Various precursors include silane, dichlorosilane, trichlorosilane, and silicon tetrachloride. Different precursors may affect the angle of dislocation and thus the location of the cross-point 206.

Figure 3:
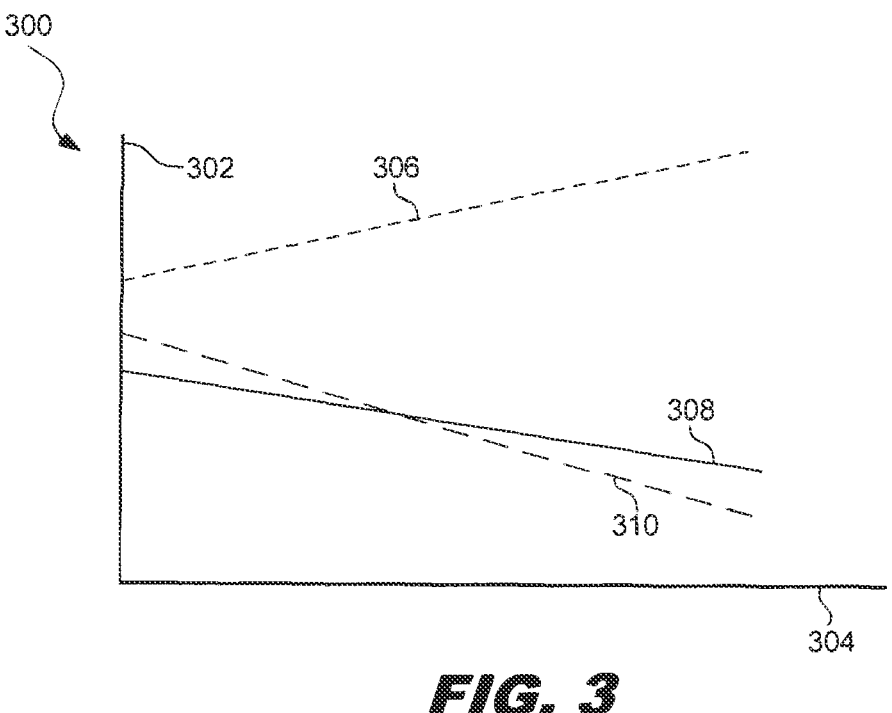
FIG. 3 is a diagram showing a relationship between pressure and the nature of the defects within the epitaxial region, in accordance with some embodiments.

FIG. 3 is a diagram showing a relationship between pressure and the nature of the defects within the epitaxial straining region. In this example, the vertical axis 302 represents length. The horizontal axis 304 represents pressure. The smaller dotted line 306 represents the distance (e.g. 210, FIG. 2) from the cross-point to the top of the straining region. The larger dotted line 310 represents the distance (e.g. 208, FIG. 2) between the cross-point and the bottom of the straining region. The solid line 308 represents the distance (e.g. 212, 214, FIG. 2) between the cross-point 206 and the sides of the straining region.

Pressure is an important component of an epitaxial growth process. The pressure under which the epitaxial growth process is applied will affect the nature of the growth process itself. For example, the pressure may range between 0 and 700 torr. Other pressure ranges are contemplated.

As the pressure increases, the angle of the dislocations becomes shallower. Thus, the depth of the cross-point increases. Thus, the length represented by 306 increases. Additionally, the length represented by 310 decreases. Because the cross-point gets lower, the distance between the cross-point and the sides, represented by line 308 also gets smaller due to the shape of the recess.

Figure 4:
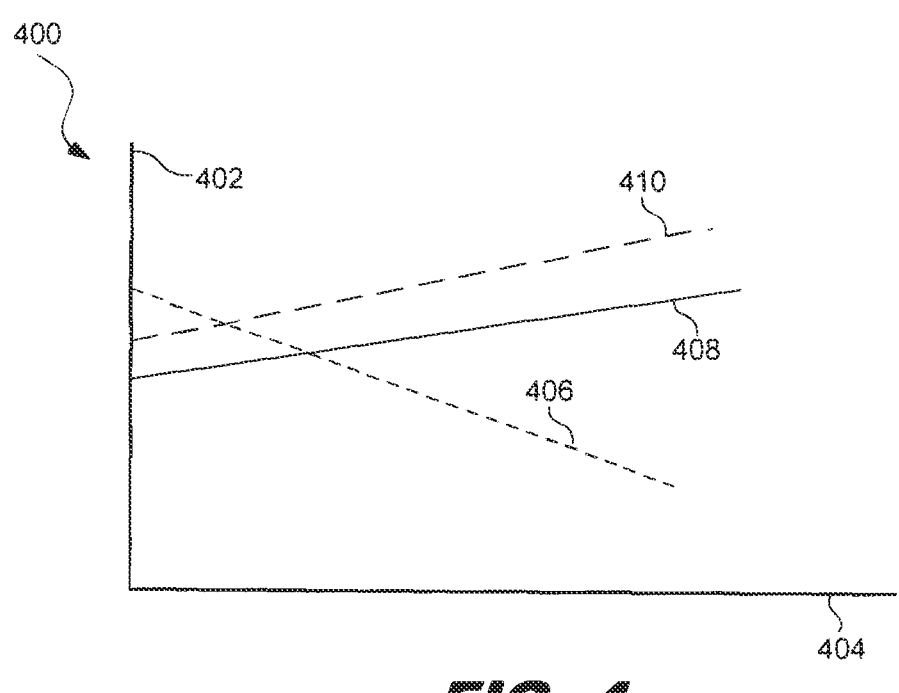
FIG. 4 is a diagram showing a relationship between temperature and the nature of the defects within the epitaxial region, in accordance with some embodiments.

FIG. 4 is a diagram showing a relationship between temperature and the nature of the defects within the epitaxial region. Specifically, FIG. 4 is a graph 400 showing the relationship between temperature and the position of the cross-point. In this example, the vertical axis 402 represents length. The horizontal axis 404 represents temperature. The smaller dotted line 406 represents the distance (e.g. 210, FIG. 2) from the cross-point to the top of the straining region. The larger dotted line 410 represents the distance (e.g. 208, FIG. 2) between the cross-point and the bottom of the straining region. The solid line 408 represents the distance (e.g. 212, 214, FIG. 2) between the cross-point and the sides of the straining region.

Temperature is also an important component of the epitaxial growth process. Specifically, the temperature at which the process is applied can affect the nature of the dislocation. In one example, the temperature at which the process is applied may range from about 600 degrees Celsius to about 800 degrees Celsius. Other temperature ranges are contemplated.

As the temperature of the epitaxial process increases, the location of the cross-point gets closer to the top of the straining region. Thus, the line 406, representing the distance between the cross-point and the top of the straining region decreases. Accordingly, the line 410 representing the distance between the cross-point and the bottom of the straining region increases. Because the cross-point is rising, the distance between the cross-point and the sides of the straining region, represented by line 408, also increases due to the shape of the straining region.

Figure 5:
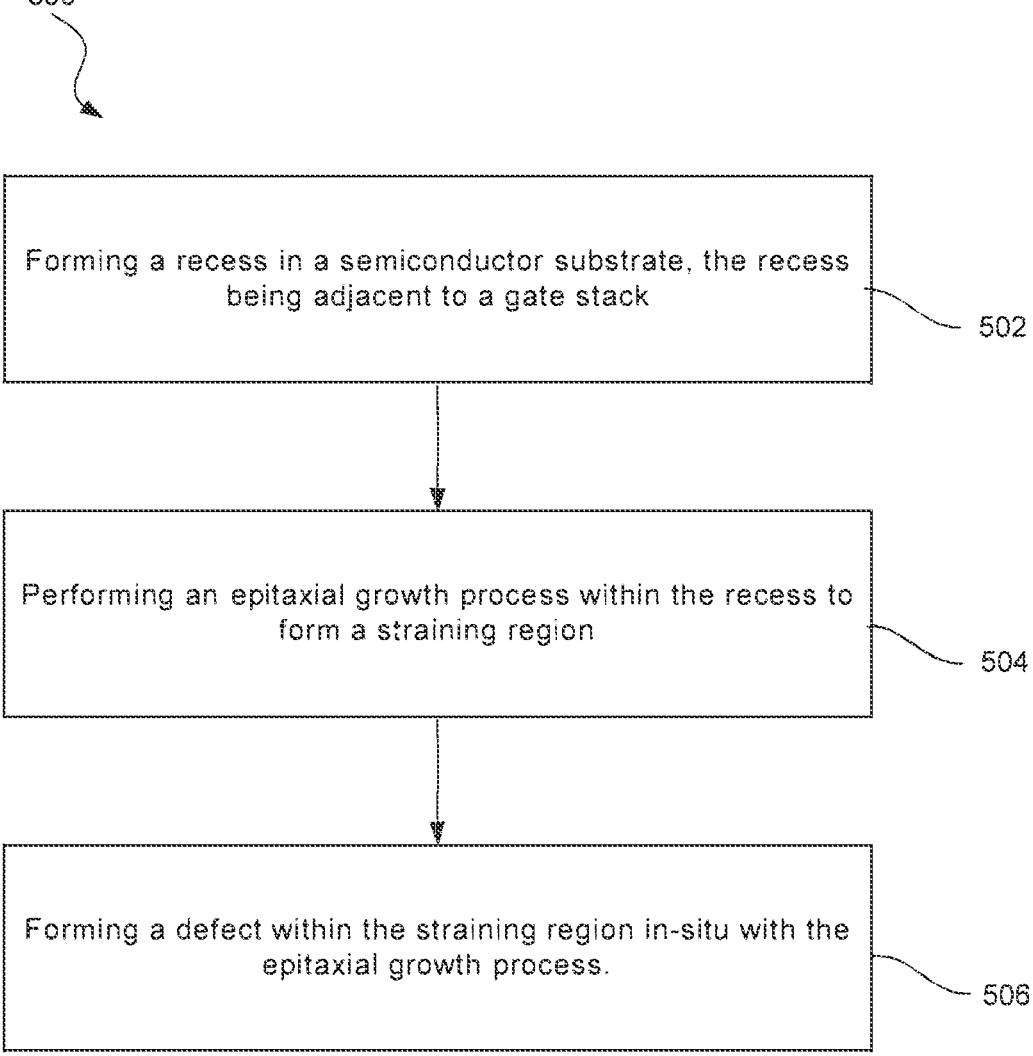
FIG. 5 is a flowchart showing an illustrative method for performing an in-situ straining epitaxial process, in accordance with some embodiments.

FIG. 5 is a flowchart showing an illustrative method for performing an in-situ straining epitaxial process. According to the present example, the method 500 includes a step 502 for forming a recess in a semiconductor substrate, the recess being adjacent to a gate stack. The gate stack may also be placed above a channel region. The recess may be formed through various fabrication processes such as etching.

According to the present example, the method 500 further includes a step 504 for performing an epitaxial growth process within the recess to form a straining region. The straining region may be doped with an n-type dopant. Additionally, the straining region may be made of a semiconductor material such as silicon carbide.

According to the present example, the method 500 further includes a step 506 forming a defect within the straining region in-situ with the epitaxial growth process. The defect may include two dislocations that cross to form an x-shape. The cross-point of the x-shape may be positioned as desired based on tuning various parameters of the epitaxial growth process. For example, various parameters such as pressure, temperature, doping concentration, and precursor type may tuned in order to provide the desired characteristics of the defect.

According to one embodiment, a method includes forming a recess in a semiconductor substrate, the recess being adjacent to a gate stack, performing an epitaxial growth process within the recess to form a straining region, forming a defect within the straining region in-situ with the epitaxial growth process.

According to one embodiment, a method includes, forming a recess in a semiconductor substrate, the recess being adjacent to a gate stack, the gate stack positioned above a channel. The method further includes performing an epitaxial growth process within the recess to form a straining region to cause a tensile strain on the channel, forming a defect within the straining region in-situ with the epitaxial growth process, the defect comprising at least two dislocations that form a cross-point within the straining region. The position of the cross-point is tuned by adjusting parameters of the epitaxial growth process.

According to one embodiment, a semiconductor device includes an epitaxial straining region formed within a semiconductor substrate, the straining region being positioned adjacent to a gate stack, the gate stack being positioned above a channel. The straining region comprises a defect comprising two crossing dislocations such that a cross-point of the dislocations is closer to a bottom of the straining region than to a top of the straining region. The straining region comprises an element with a smaller lattice constant than a material forming the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a semiconductor substrate comprising a first channel region, a second channel region, and a straining region disposed between and interfacing the first channel region and the second channel region;
   a first gate stack over the first channel region; and
   a second gate stack over the second channel region,

wherein the straining region comprises a defect comprising two crossing dislocations, wherein the two crossing dislocations extend from a bottom surface of the straining region to a top-most surface of the straining region; and wherein a lattice constant of the straining region is smaller than a lattice constant of a material forming the semiconductor substrate, wherein the two crossing dislocations cross at a cross-point to form an X-shape, wherein the straining region directly interfaces the semiconductor substrate, wherein the X-shape is symmetrical, wherein the cross-point is closer to the bottom surface of the straining region than to the top-most surface of the straining region.

2. The device of claim 1, wherein the straining region is doped with an n-type dopant.

3. The device of claim 1,
wherein the straining region comprises silicon carbide (SiC) doped with phosphorous.

4. The device of claim 1, wherein the straining region is such that it causes a tensile strain on the channel underneath the gate stack.

5. The device of claim 1, wherein the straining region comprises silicon.

6. The device of claim 1, wherein the straining region comprises silicon carbide.

7. The device of claim 1, further comprising a doped silicon layer disposed over the straining region.

8. The device of claim 1, wherein the straining region is doped with phosphorous.

9. A semiconductor device comprising:
a semiconductor substrate comprising a first channel region and a second channel region;
a first gate stack over the first channel region;
a second gate stack over the second channel region;
a source/drain region sandwiched between and interfacing the first channel region and the second channel region;
a first defect within the source/drain region;
a second defect within the source/drain region positioned such that both the first defect and the second defect cross at a cross-point to form an X-shape and extend from a bottom surface of the source/drain region to a top surface of the source/drain region; and
a semiconductor layer directly on a top surface of the source/drain region,
wherein the X-shape is symmetrical with respect to the first channel region and the second channel region,
wherein the cross-point is closer to the bottom surface of the source/drain region than to the top surface of the source/drain region,
wherein the source/drain region directly interfaces the semiconductor substrate,

wherein a lattice constant of the source/drain region is smaller than a lattice constant of the semiconductor substrate.

10. The semiconductor device of claim 9, wherein a cross-point of the first defect and the second defect is at a specific location within the source/drain region such that there is an equal distance between the cross-point and sidewalls of the source/drain region on both sides of the cross-point.

11. The semiconductor device of claim 9, wherein the source/drain region is such that it causes a tensile strain on a channel underneath the gate stack.

12. The semiconductor device of claim 9, wherein the source/drain region comprises a combination of silicon and an element with a smaller lattice constant.

13. The semiconductor device of claim 9, wherein the source/drain region comprises silicon carbide.

14. The semiconductor device of claim 9, wherein the source/drain region is doped with an n-type dopant.

15. The semiconductor device of claim 9, wherein the source/drain region is doped with phosphorous.

16. A semiconductor device comprising:
a substrate comprising a first channel region, a second channel region and a source/drain region disposed between the first channel region and the second channel region;
a first gate stack over the first channel region;
a second gate stack over the second channel region;
a first dislocation and a second dislocation within the source/drain region; and
a doped silicon layer over the source/drain region,
wherein the first dislocation and the second dislocation extend along different directions to cross at a cross-point to form an X-shape within the source/drain region,
wherein the X-shape is symmetrical,
wherein the cross-point is closer to a bottom surface of the source/drain region than to a top surface of the source/drain region,
wherein a lattice constant of the source/drain region is smaller than a lattice constant of the substrate,
wherein the source/drain region directly interfaces the substrate.

17. The semiconductor device of claim 16, wherein the cross point is closer to a bottom of the source/drain region than to a top of the source/drain region.

18. The semiconductor device of claim 16, wherein the source/drain region is such that it causes a tensile strain on the channel region.

19. The semiconductor device of claim 16, wherein the source/drain region comprises a combination of silicon and an element with a lattice constant smaller than a lattice constant of silicon.

20. The semiconductor device of claim 19, wherein the source/drain region comprises silicon carbide.

* * * * *